United States Patent [19]

Ishihara et al.

[11] Patent Number: 5,299,152

[45] Date of Patent: Mar. 29, 1994

[54] ANTI-FUSE MEMORY DEVICE WITH SWITCHED CAPACITOR SETTING METHOD

[75] Inventors: Hiroshi Ishihara, Tenri; Kenichi Tanaka, Nara; Keizo Sakiyama, Kashihara, all of Japan

[73] Assignee: Sharp Kabushiki Kaisha, Osaka, Japan

[21] Appl. No.: 827,073

[22] Filed: Jan. 28, 1992

Related U.S. Application Data

[62] Division of Ser. No. 716,773, Jun. 18, 1991, Pat. No. 5,119,163.

[30] Foreign Application Priority Data

Jun. 22, 1990 [JP] Japan ................................. 2-164797

[51] Int. Cl.⁵ .............................................. G11C 17/16
[52] U.S. Cl. ....................................... 365/96; 365/100; 365/102; 365/103; 365/225.7; 257/530
[58] Field of Search ................ 365/96, 100, 102, 103, 365/104, 225.7; 257/530

[56] References Cited

U.S. PATENT DOCUMENTS 4,899,205 2/1990 Hamdy et al. .

OTHER PUBLICATIONS

E. Hamdy et al.; "Dielectric Based Antifuse For Logic and Memory ICs"; pp. 786-789, 1988 IEDM Conf. Proc.

Primary Examiner—Joseph E. Clawson, Jr.

[57] ABSTRACT

A semiconductor device includes memory cells each of which include a plurality of groups of an anti-fuse and a transistor connected in series; a capacitor including first and second electrodes, with the first electrode connected to a bit line of the memory cell; a first switch connected between the bit line and a power source; a second switch connected between the power source and the second electrode of the capacitor; and a third switch connected between the second electrode of the capacitor and a ground. A specific memory cell is selected out of the memory cells, and a superposed supply voltage is applied through the capacitor to the anti-fuse of the specific memory by turning on and/or off the first through third switches, so that a storage of information in the memory cell can be performed.

5 Claims, 2 Drawing Sheets

ANTI-FUSE MEMORY DEVICE WITH SWITCHED CAPACITOR SETTING METHOD

This application is a divisional of copending application Ser. No. 07/716,773, now U.S. Pat. No. 5,119,163 filed on Jun. 18, 1991. The entire contents of which are hereby incorporated by reference.

BACKGROUND OF THE INVENTION

(1) Field of the Invention

The present invention relates to a semiconductor device, and more specifically, it relates to a semiconductor device having an anti-fuse, in which a dielectric breakdown of the anti-fuse makes it conductive to perform a storage of information.

(2) Description of the Prior Art

Recently, an anti-fuse has often been used as a component of a memory cell of a PROM or as an element for closing a circuit (e.g., "Dielectric Based Anti-fuse for Logic and Memory IC", IEDM 88, pp 786–789). The anti-fuse includes an insulating film and electrodes holding it therebetween, and the anti-fuse is subjected to a dielectric breakdown to become irreversibly conductive when a specified programming voltage $V_p$ is applied between the electrodes. This enables the memory cell of the PROM to store information (program), and it also leads to a closing of the circuit.

There are some known anti-fuse elements; for example, U.S. Pat. No. 4,899,205 discloses an anti-fuse element under the title of "ELECTRICALLY-PROGRAMMABLE LOW-IMPEDANCE ANTI-FUSE ELEMENT".

An ordinary operating voltage (supply voltage) $V_{cc}$ is set to a value smaller than the programming voltage $V_p$ so that the anti-fuse is not broken down in the programming and may not be broken down during the PROM (Programmable Read Only Memory) reading operation or during the operation of the circuit. For this reason, conventionally, there arises the problem that in programming the programming voltage $V_p$ must be supplied from the outside.

Accordingly, it is an object of the present invention to provide a semiconductor device capable of storing information without supplying the programming voltage from the outside in some way.

SUMMARY OF THE INVENTION

To attain the above-mentioned object, the present invention provides a semiconductor device comprising a plurality of anti-fuses which are subject to a dielectric breakdown to become conductive so that a storage of information can be performed; selecting means for selecting a specific anti-fuse out of the plurality of anti-fumes; wiring connected to the selected anti-fuse; a capacitor including first and second electrodes, with the first electrode being connected to the wiring; a first switch connected between a power source and the wiring; a second switch connected between the power source and the second electrode of the capacitor; and a third switch connected between the second electrode and a ground. The specific anti-fuse to be broken down is selected out of the plurality of anti-fuses by the selecting means, the first and third switches are turned on while the second switch is turned off to bias the capacitor to a supply voltage, and thereafter, the first and third switches are turned off while the second switch is turned on to apply a superposed supply voltage through the capacitor to the specific anti-fuse by a capacity coupling, so that the specific anti-fuse can be subjected to a dielectric breakdown to perform the storage of information.

Also, a semiconductor device according to the present invention comprises a plurality of memory cells each of which includes an anti-fuse and a transistor connected in series, in which the anti-fuse is subjected to a dielectric breakdown to become conductive so that a storage of information can be performed; a bit line connected to the memory cells; a capacitor comprising first and second electrodes, with the first electrode being connected to the bit line; a first switch connected between a power source and the bit line; a second switch connected between the power source and the second electrode of the capacitor; and a third switch connected between the second electrode of the capacitor and a ground. The transistor of a specific memory cell where information is to be stored is turned on to select the memory cell out of the plurality of memory cells, the first and second switches are turned on while the second switch is turned off to bias the capacitor to a supply voltage, and thereafter, the first and third switches are turned off while the second switch is turned on to apply the superposed supply voltage through the capacitor to the anti-fuse by a capacity coupling. As a result the anti-fuse can be subjected to a dielectric breakdown to perform the storage of information in the memory cell.

As has been described, with the configuration according to the present invention, when the superposed supply voltage is applied through the capacitor to the antifuse by the capacity coupling, the programming voltage which doubles the supply voltage can be applied even with an ordinary power source (voltage $V_{cc}$) alone. Thus, with an application of the programming voltage, the anti-fuse can be subjected to a dielectric breakdown. In this way, unlike the conventional case, a storage of information can be performed without supplying the programming voltage from the outside in some way.

DESCRIPTION OF THE DRAWINGS

An embodiment of the invention will now be described by way of example and with reference to the accompanying drawings, in which.

DESCRIPTION OF THE PREFERRED EMBODIMENTS

Figure 1:
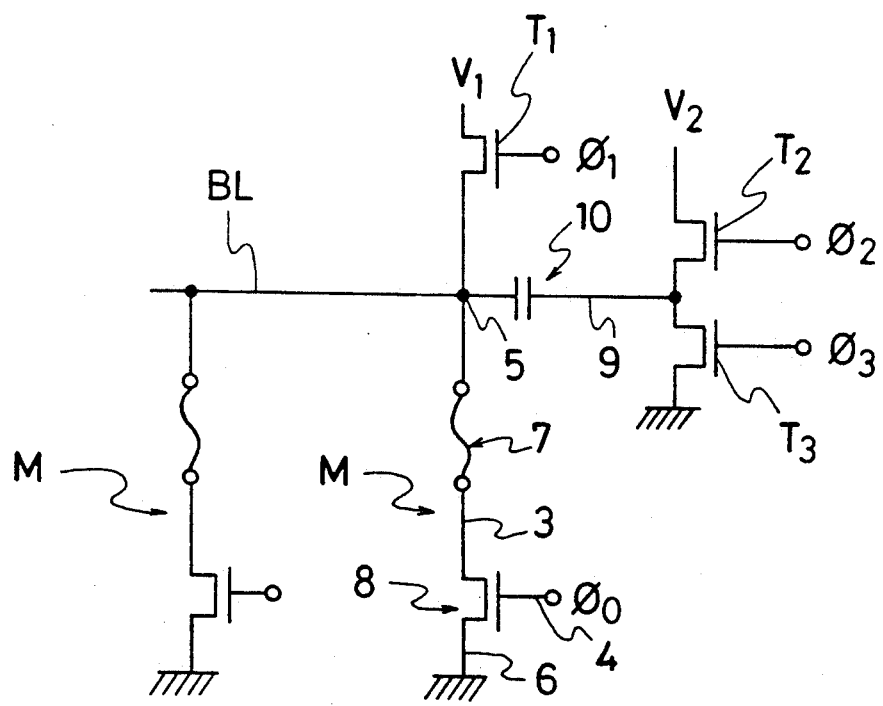
FIG. 1 is a diagram showing an equivalent circuit which is a major portion of a PROM of an embodiment in a semiconductor device according to the present invention.

As shown in FIG. 1, a PROM includes a plurality of memory cells M each of which includes an anti-fuse 7 and a transistor 8 connected in series, and a bit line BL connected to the memory cells. The Prom also includes a capacitor 10 having an electrode 5 connected to the bit line BL. The PROM further includes a transistor $T_1$ serving as a first switch connected between a power source (potential $V_1$) and the bit line BL, a transistor $T_2$ serving as a second switch connected between the power source (potential $V_2$) and another electrode 9 of the capacitor 10, and a transistor $T_3$ serving as a third switch connected between the electrode 9 of the capacitor 10 and a ground.

Figure 2:
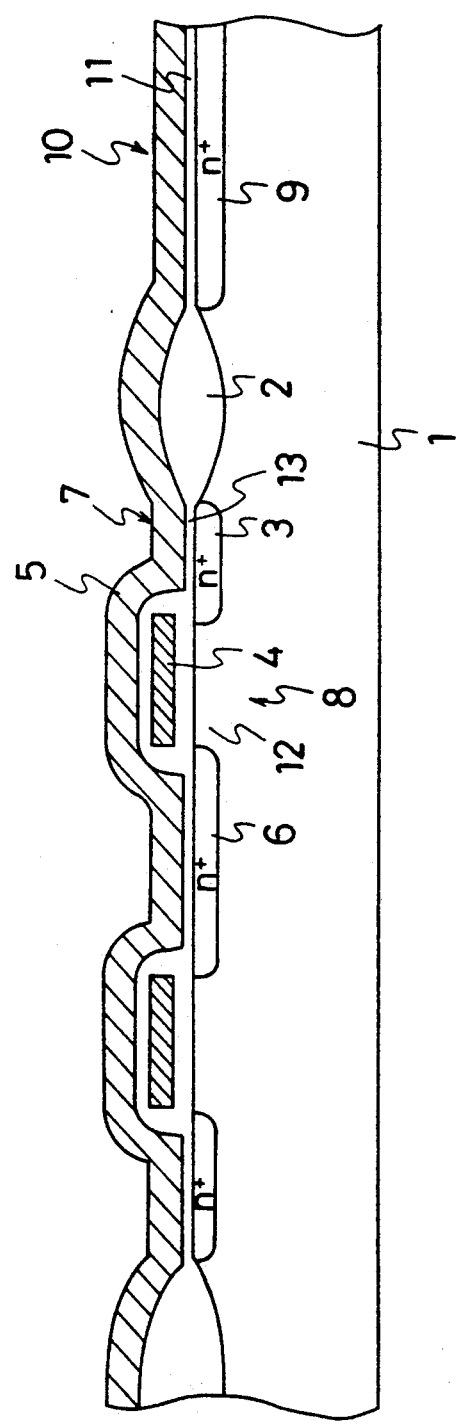
FIG. 2 is a diagram showing a sectional structure of a major portion of the PROM.

As shown in FIG. 2, the transistor 8 in the memory cell M includes n+ type regions 3 and 6 formed in a surface of a p type semiconductor substrate 1, and a gate electrode 4 covering a channel region 12 between the n+ regions 3 and 6. The anti-fuse 7 includes the n+ region 3, the electrode 5 and an insulating film 13 sandwiched between them. The capacitor 10 includes an the n+ type region (electrode) 9 formed in the surface of the substrate 1, an insulating film 11 covering the surface of the n+ type region 9, and the electrode (the electrode shared with the anti-fuse 7) 5. Reference numeral 2 denotes a local oxidation film separating the transistor 8 from the capacitor 10.

When the information is stored in the PROM, a signal $\phi_0$ is first applied to the gate electrode 4 of the transistor 8 to turn on the transistor 8 of the memory cell M, in which the information is to be stored, of the plurality of memory cells M. Thus, with the memory cell M specified, signals $\phi_1$ and $\phi_3$ are applied to gates of the transistors $T_1$ and $T_3$ to turn the transistors $T_1$ and $T_3$ on while a signal $\phi_2$ is applied to a gate of the transistor $T_2$ to turn the transistor $T_2$ off. Then, the electrodes 5 and 9 of the capacitor 10 are biased to be at a potential $V_1$ and at a ground potential, respectively. The voltage $V_1$ is applied to the anti-fuse 7 in the specified memory cell M. Next, the levels of the signals $\phi_1$, $\phi_3$ and $\phi_2$ are inverted to turn the transistors $T_1$ and $T_3$ off and turn the transistor $T_2$ on. Consequently, a voltage pulse $V_2$ is transmitted through the capacitor 10 to the bit line BL by a capacity coupling. Thus, a superposed voltage $(V_1+V_2)$ is applied to the anti-fuse 7. The superposed voltage $(V_1+V_2)$ causes a dielectric breakdown of the anti-fuse 7 to enable a storage of the information in the memory cell M.

When the storage of the information is carried out in the above-mentioned way, the programming voltage which doubles the voltage of the power source can be applied to the anti-fuse 7 even if the potential of the power source is in the condition that $V_1=V_2=V_{cc}$, that is, even if the programming voltage simply equals the ordinary reading-out voltage $V_{cc}$. In this way, unlike the conventional case, a storage of information can be performed without supplying the programming voltage $V_p$ from the outside in some way.

While the previous description on this embodiment treats a PROM, it is naturally not intended that the invention be limited to the precise form; the present invention can be applied to various uses, such as a closing of a circuit and the like.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A method of making a conduction by breaking down an anti-fuse in a semiconductor device that includes a plurality of anti-fuses and a capacitance with one capacitance electrode being connected to first terminals of the anti-fuses, the method comprising the steps of:

turning on a transistor connected between a second terminal of a specific anti-fuse and a basic potential for selecting the specific anti-fuse out of the plurality of anti-fuse;

impressing a first potential which have predetermined potential difference on one capacitance electrode and the first terminal of the specific anti-fuse, and setting the ground level on the other capacitance electrode so as to charge the one capacitance electrode, cutting off the first potential, and impressing a second potential on the other capacitance electrode, thereby the first potential and the second potential being superposed on one capacitance electrode, applying the superposed potential to the first terminal of the specific anti-fuse to execute a conduction by the breakdown of the specific anti-fuse.

2. A method as claimed in claim 1, wherein the first and second potentials are of the same polarity.

3. A method as claimed in claim 1, wherein the first and second potentials are the same voltage as the power source.

4. A method as claimed in claim 1, wherein a combination of the anti-fuse and the transistor forms a unit memory cell, and the breakdown of one anti-fuse performs the storage of information into a memory cell.

5. A method as claimed in claim 1, wherein the basic potential is a ground level.

* * * * *